US012658927B2

(12) United States Patent
Fagg

(10) Patent No.: US 12,658,927 B2
(45) Date of Patent: Jun. 16, 2026

(54) FREQUENCY CORRECTION LOOP WITH DEADZONE AND HYSTERESIS

(71) Applicant: Renesas Electronics America Inc., Milpitas, CA (US)

(72) Inventor: Russell Fagg, Tempe, AZ (US)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 18/808,708

(22) Filed: Aug. 19, 2024

(65) Prior Publication Data

US 2026/0051893 A1     Feb. 19, 2026

(51) Int. Cl.
| | |
|---|---|
| *H03L 7/089* | (2006.01) |
| *H03D 13/00* | (2006.01) |
| *H03L 7/087* | (2006.01) |
| *H03L 7/093* | (2006.01) |
| *H03L 7/107* | (2006.01) |

(52) U.S. Cl.
CPC ......... *H03L 7/0891* (2013.01); *H03D 13/004* (2013.01); *H03L 7/087* (2013.01); *H03L 7/093* (2013.01); *H03L 7/1072* (2013.01)

(58) Field of Classification Search
CPC ....... H03L 7/0891; H03L 7/087; H03L 7/085; H03L 7/089; H03L 7/091; H03L 7/093; H03D 13/00; H03D 13/003; H03D 13/004
See application file for complete search history.

(56) References Cited

U.S. PATENT DOCUMENTS

2023/0318608 A1 * 10/2023 Uehara ................... H03L 7/099
327/291

FOREIGN PATENT DOCUMENTS

CN           116633348 A  * 8/2023 ............. H03L 7/085

* cited by examiner

*Primary Examiner* — Ryan Johnson
(74) *Attorney, Agent, or Firm* — SCULLY, SCOTT, MURPHY & PRESSER, P.C.

(57) ABSTRACT
Semiconductor devices for synchronizing networks are described. A semiconductor device can include a phase lock loop of a timing circuit. The phase lock loop includes a voltage-controlled oscillator, a sub-sampling phase lock loop circuit and a frequency correction loop circuit. The frequency correction loop circuit is configured to activate a charge pump to inject a charge into the voltage-controlled oscillator based on a phase difference between a reference signal and a feedback signal being greater in magnitude than a deadzone delay parameter plus a hysteresis delay parameter and de-activate the charge pump based on the magnitude of the phase difference between the reference signal and the feedback signal falling below the deadzone delay parameter.

14 Claims, 7 Drawing Sheets

700

702
Activate phase locked loop (PLL)

704
Determine the phase difference between a reference frequency and a feedback frequency is above a first predetermined threshold 706
Activate a charge pump of a frequency correction loop (FCL)

708
Determine the phase difference between the reference frequency and the feedback frequency is below a second predetermined threshold 710
Deactivate the charge pump of the FCL

Fig. 7

FREQUENCY CORRECTION LOOP WITH DEADZONE AND HYSTERESIS

BACKGROUND

The present disclosure relates in general to semiconductor devices implementing a phase lock loop, and more particularly, to a phase lock loop having a frequency correction loop with deadzone and hysteresis.

A timing circuit including transceivers and clock circuits can be connected to multiple networks to synchronize the multiple networks. The timing circuit can include a phase-locked loop (PLL) which may include a phase detector, charge pump, loop filter, feedback dividers, and voltage-controlled oscillator (VCO) in a feedback loop.

PLLs sometimes rely on a feedback divider to frequency and phase lock a VCO to a reference frequency but may suffer from several shortcomings. For example, in such a PLL, the feedback divider power consumption scales with the VCO frequency and may become a significant noise source. In practice, the feedback divider's size and power consumption increase for higher VCO frequencies and tighter phase noise requirements.

In a fractional N PLL, the quantization noise from the randomization of the feedback divider ratio is shaped by a Delta Sigma Modulator (DSM) so that it may be filtered by the PLL's low pass filter response. Higher order modulators provide superior noise shaping but place increasingly stringent requirements on the linearity of the Phase Frequency Detector (PFD) and charge pump. Circuit non-linearities produce folding of the high frequency shaped noise in-band where it will contribute to the integrated jitter of the PLL. The PFD and charge pump can be linearized by offsetting the charge pump to only source current into the loop filter. This avoids the non-linearity arising from static and dynamic mismatches between the charge pump's source and sink currents but increases the charge pump and PFD noise and the PLL's reference spur.

The gain and noise of a PLL is typically limited by the gain of the PFD and charge pump and the feedback divider ratio. The charge pump gain can be increased by increasing biasing currents which necessitates larger devices within the charge pump to support a given VCO control voltage range. Scaling up the charge pump devices typically necessitates scaling up the PFD devices, substantially increasing the power consumption of the PLL at higher reference frequencies.

SUMMARY

In one embodiment, a semiconductor device is disclosed that comprises a phase lock loop of a timing circuit. The phase lock loop comprises a voltage-controlled oscillator, a sub-sampling phase lock loop circuit and a frequency correction loop circuit. The frequency correction loop circuit is configured to activate a charge pump to inject a charge into the voltage-controlled oscillator based on a phase difference between a reference signal and a feedback signal being greater in magnitude than a deadzone delay parameter plus a hysteresis delay parameter and de-activate the charge pump based on the magnitude of the phase difference between the reference signal and the feedback signal falling below the deadzone delay parameter.

In one embodiment, a frequency correction loop of a timing circuit is disclosed. The frequency correction loop comprises a charge pump that is configured to inject a charge into a voltage-controlled oscillator of the timing circuit and a phase detector that is configured to control an activation of the charge pump. The phase detector comprises a first latch that is configured to be set based on a reference signal to generate a first latch output signal, a second latch that is configured to be set based on a feedback signal from the voltage-controlled oscillator to generate a second latch output signal, a first latch delay circuit, a third latch that is configured to be set based on the first latch output signal and a first delay signal output by the first latch delay circuit, a second latch delay circuit and a fourth latch that is configured to be set based on the second latch output signal and a second delay signal output by the second latch delay circuit.

In one embodiment, a semiconductor device comprising a phase detector of a timing circuit. The phase detector is configured to control an activation of a charge pump of the timing circuit. The charge pump is configured to inject a charge into a voltage-controlled oscillator of the timing circuit. The phase detector is further configured to enter a set state from a reset state in response to a phase difference between a reference signal and a feedback signal exceeding a predetermined deadzone delay corresponding to the reference signal plus a predetermined hysteresis delay. The phase detector is configured to activate the charge pump when in the set state and disable the charge pump when in the reset state. The phase detector is further configured to enter the reset state from the set state in response to the phase difference between the reference signal and the feedback signal being reduced to less than the predetermined deadzone delay.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

BRIEF DESCRIPTION OF THE DRAWINGS

FIG. 7 is a flowchart of an example process that can implement a FCL with deadzone and hysteresis in one embodiment.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
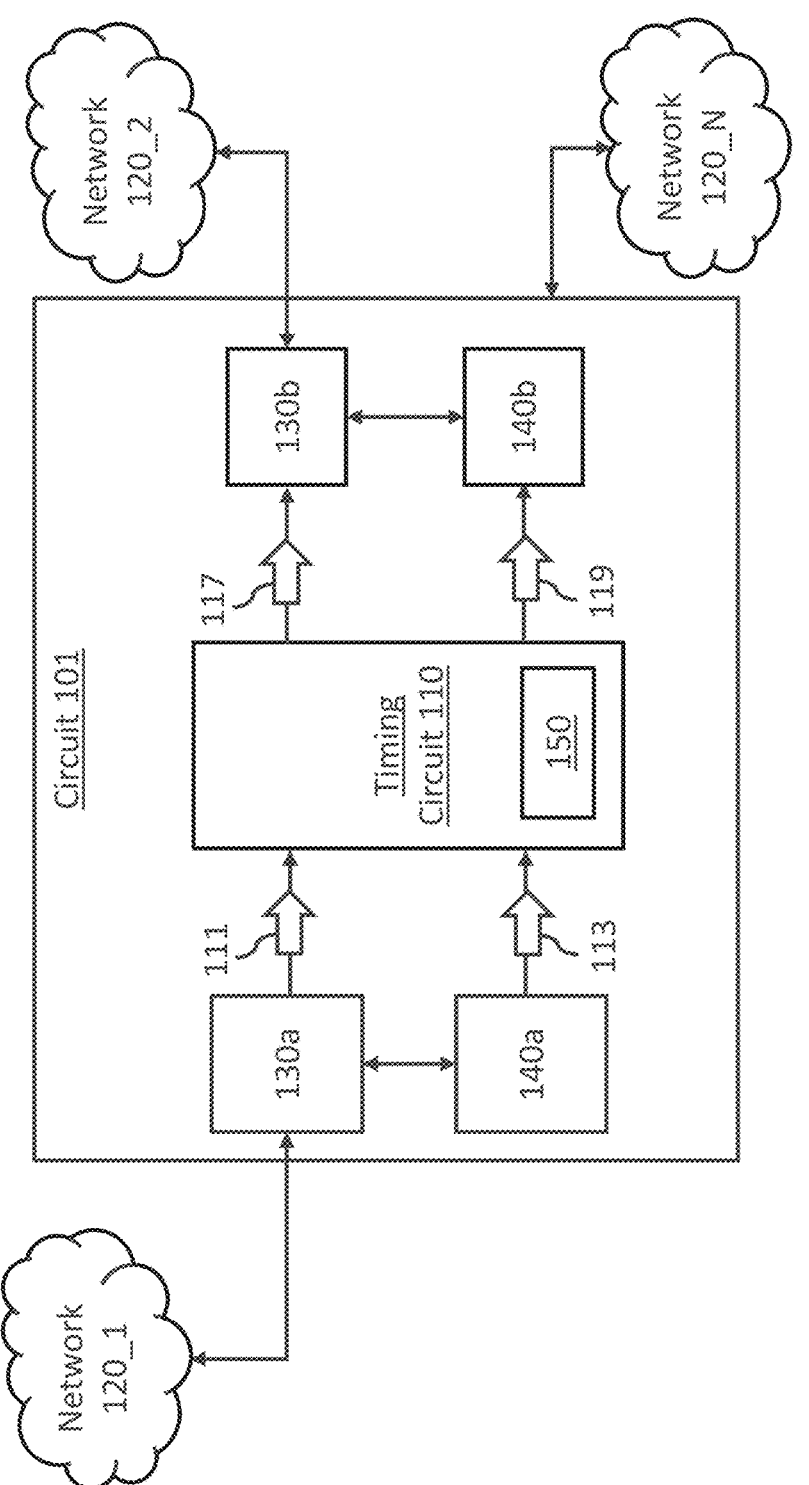
FIG. 1 is a block diagram of an example system that can implement a timing circuit in one embodiment.

FIG. 1 is a block diagram of an example system 100 that can implement a timing circuit 110 having a PLL with a frequency correction loop having deadzone and hysteresis in one embodiment.

System 100 can include a network circuit 101 and a plurality of networks, or N networks 120_1, 120_2, . . . , 120_N. Network circuit 101 can be an integrated circuit (IC) implement a telecommunications circuit. In an example, the circuit 101 may be implemented as a single IC or as a number of ICs on a printed circuit board (e.g., a network card, server blade, etc.). By way of example, network circuit 101 can implement a portion of a telecommunications network circuit. In another example, network circuit 101 can be implemented as one or more components of a Synchronous Ethernet (e.g., SyncE) switch and/or a router box (e.g., telecommunications device). System 100 can be implemented to synchronize multiple networks (e.g., two or more) 120_1-120_N. The number of networks 120_1 to 120_N can be arbitrary depending on a desired implementation of system 100.

In examples where network circuit 101 is being implemented as a switch and/or router, such as a SyncE switch and/or router. network circuit 101 can include one or more transceivers, such as transceivers 130a, 130b, one or more precision timing protocol (PTP) modules, such as PTP modules 140a, 140b, and a timing circuit 110. Each one of transceivers 130a, 130b can be, for example, an Ethernet physical layer transceiver chip. In an example shown in FIG. 1, network 20a can be connected to transceiver 130a and network 20b can be connected to transceiver 130b. Transceiver 130a can be connected to PTP module 140a and timing circuit 110. Transceiver 130b can be connected to PTP module 140b and timing circuit 110. Transceiver 130a can be configured to send data to, and/or receive data from, network 120_1, PTP module 140a and timing circuit 110. Transceiver 130b can be configured to send data to, and/or receive data from, network 120_2, PTP module 140b and timing circuit 110. Each one of transceivers 130a, 130b can be configured to generate and/or receive a clock signal under the SyncE protocol.

Timing circuit 110 can implement a network card and/or a network circuit board. Timing circuit 110 can be configured to synchronize a timing of communication signals transmitted and/or received using one or more communication protocols. In some embodiments, the timing circuit 110 can be implemented as a component of a SyncE router and/or switch (e.g., circuit 101). In one example, timing circuit 110 can be used to implement a synchronous Ethernet Wide Area Network (WAN). In some embodiments, timing circuit 110 can be implemented to facilitate synchronous communication in a digital subscriber line access multiplexer (DSLAM). In an aspect, transceivers 130a, 130b, PTP modules 140a, 140b, and/or timing circuit 110 can be deployed throughout a telecommunications network. In one example, the transceivers 130a, 130b, the PTP modules 140a, 140b and/or the timing circuit 110 can be deployed in a road-side cabinet and/or a server rack. In examples where network circuit 101 implements a SyncE switch and/or router box, networks 120_1 to 120_N can be coupled to one another.

In an example, networks 120_1 to 120_N can implement a number of local area networks (LANs) having operations that may be synchronized with one another. In various embodiments, networks 120_1 to 120_N can include networks based on time division multiplexing (TDM) (e.g., synchronous optical networks (SONET), synchronous digital hierarchy (SDH) network, or plesiochronous digital hierarchy (PDH) networks), and/or Ethernet-based packet networks. The networks 120_1 to 120_N can be configured to facilitate delivery of a variety of communication services. Each one of PTP modules 140a, 140b can implement an IEEE 1588 compliant packet-based timing scheme. In an example, PTP module 140a can implement a slave clock and PTP module 140b can implement a master clock, thus PTP module 140b has a higher hierarchy than PTP module 140a. PTP module 140b can initiate transmission of synchronization messages to slave clocks (e.g., PTP module 140a) and determines the time base for the PTP slave clocks lower in hierarchy.

In the example shown in FIG. 1, network 120_1 can be a transmitting network and one or more of the networks 120_2 to 120_N can be receiving networks. Network 120_1 can transmit data to one or more of the networks 120_2 to 120_N. In an aspect, network 120_1 being implemented as a transmitting network can function as a timing source and the rest of the networks 120_2 to 120_N can be synchronized to the timing source. In order for the data to be accurately transmitted to one or more of the networks 120_2 to 120_N, timing circuit 110 can synchronize the networks 120_1 to 120_N. When networks 120_1 is a transmitting network, transceivers 130a can recover a physical clock 111 from data being provided by network 120_1. In one embodiment, recovered physical clock 111 can be a SyncE physical clock signal. Transceiver 130a can send the recovered physical clock 111 to timing circuit 110. PTP module 140a can be implemented as a PTP slave module or PTP slave clock and can send a PTP phase 113 to timing circuit 110. PTP phase 113 can be an internal reference clock, such as a PTP phase clock signal. Timing circuit 110 can generate a 1 Pulse Per Second (1PPS) signal 119 using PTP phase 113. Timing circuit 110 can generate an output clock signal 117 that is frequency and/or phase locked with physical clock 111. Transceiver 130b can be configured to receive output clock signal 117 from timing circuit 110, where output clock signal 117 can be a SyncE transmit clock signal. The output clock signal 117, or SyncE transmit clock signal, can communicate a SyncE transmit clock for broadcasting the data provided by network 120_1 to one or more of the receiving networks 120_2 to 120_N.

PTP modules 140a, 140b can be configured to provide precise time over an Internet computing network. For example, PTP modules 140a, 140b can be interconnected by switches (e.g., dedicated, high-speed LAN segments interconnected by switches) and/or can synchronize device clocks over the Internet computing network. In the example shown in FIG. 1, PTP module 140a can implement a PTP slave module. PTP module 140a, as a PTP slave module, can send PTP phase 113 to timing circuit 110, where PTP phase 113 can be a PTP phase signal. PTP module 140b can implement a PTP master module. PTP module 140b, as a PTP master module, can receive 1PPS signal 119 that can be a 1PPS generated by timing circuit 110. Timing circuit 110 can use physical clock 111 and PTP phase 113 to generate output clock signal 117 and the 1PPS signal 119 can be used to synchronize the networks 120_1 to 120_N (e.g., a wide area network).

Figure 2:
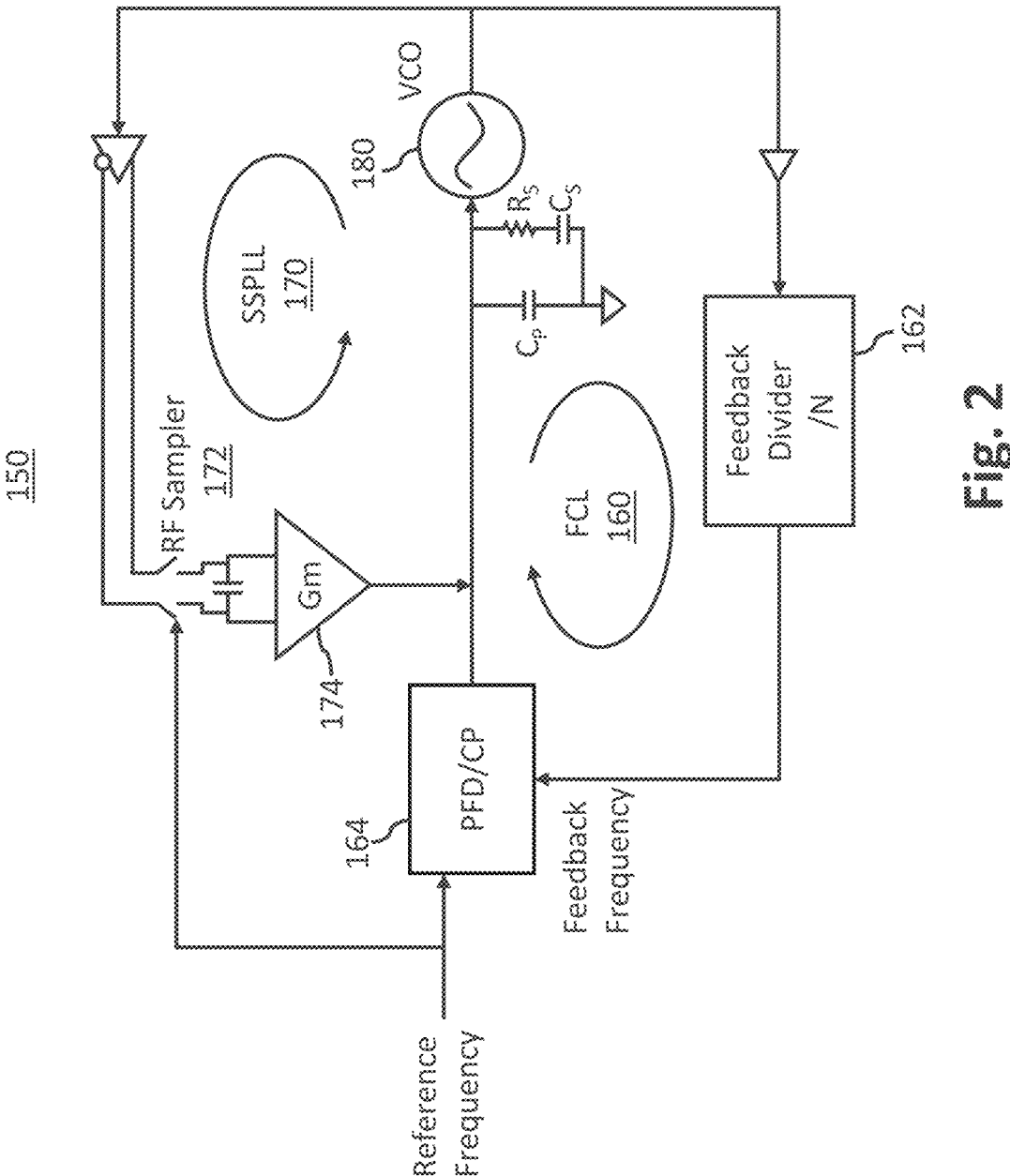
FIG. 2 is a circuit diagram of an example phase lock loop (PLL) of the timing circuit of the system of FIG. 1 in one embodiment.

With reference to FIGS. 1 and 2, timing circuit 110 implements a PLL 150 comprising a Frequency Correction Loop (FCL) 160, a Sub-sampling PLL (SSPLL) 170 and a VCO 180. Each one of PLL 150, FCL 160, and SSPLL 170 can be implemented by one or more individual pieces of hardware that comprises physical components such as active and passive circuit components, logic circuits, integrated circuits, or the like. FCL 160 comprises a feedback divider 162 and a phase frequency detector/charge pump (PFD/CP) 164. SSPLL 170 comprises an RF Sampler 172 and a gain amplifier 174. SSPLL 170 may be utilized to frequency and phase lock the PLL by directly sampling the VCO. This circumvents the need for the feedback divider 162 of FCL 160 to be constantly operational and removes the divider's power consumption and noise contribution from the PLL design when it is not active. In a SSPLL, the VCO can also be locked to a fraction of the reference frequency by sampling the VCO with a phase modulated reference frequency. The linearity of the sampling process may be much less stringent than the linearity required for a conventional PLL's charge pump and PFD because the phase modulation step is scaled by the fractional frequency and the unity feedback ratio, i.e., the quantization step is a fraction of the VCO period rather than a multiple. When using an SSPLL, the phase modulator may be linear to minimize harmonics of the fractional reference spur. The gain of a SSPLL may also be much higher than the gain of conventional PLLs because of the unity feedback ratio. This allows for much smaller bias currents, device sizes and reduced phase noise in the PLL circuitry and facilitates the design of PLLs with very high reference frequencies.

However, there are also some challenges with the use of a SSPLL to perform the frequency and phase locking. For example, SSPLLs may lock to any harmonic of the PLL's reference frequency that falls within the VCO's tuning range where locking to the wrong harmonic will cause the SSPLL to generate the wrong output frequency. Since many commercial PLLs are required to lock to a particular programmed frequency, a PLL using an SSPLL needs to be designed such that the SSPLL locks to the correct harmonic of the reference frequency.

Figure 3:
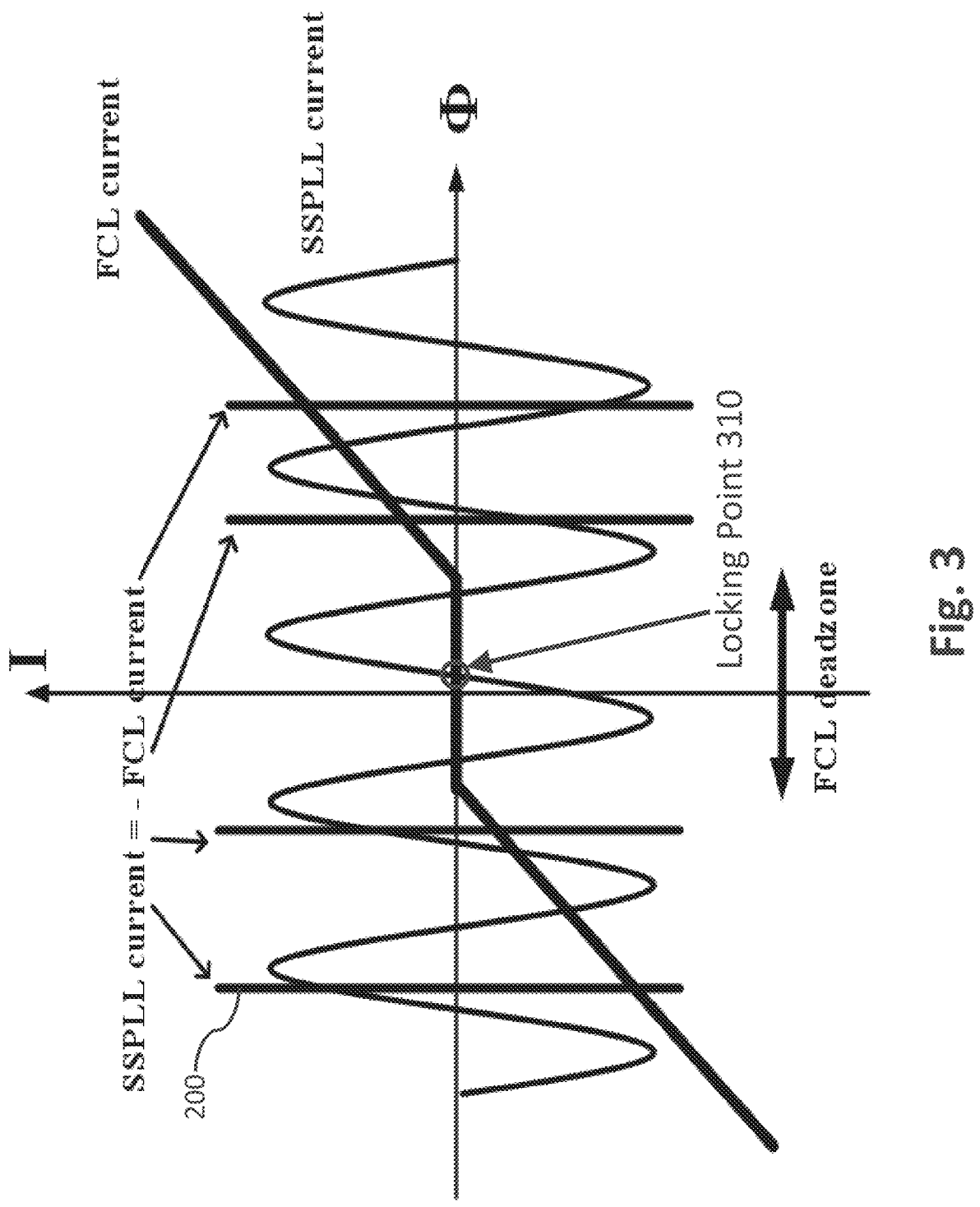
FIG. 3 is a signal diagram illustrating an interaction between a sub-sampling PLL (SSPLL) and a frequency correction loop (FCL) of the PLL of FIG. 2 that are operating simultaneously and in contention in one embodiment.

With reference again to FIG. 2, FCL 160 and SSPLL 170 may in some cases operate simultaneously. If FCL 160 has a linear gain characteristic, FCL 160 and SSPLL 170 may be in contention and FCL 160 may fail to disengage, e.g., as shown in FIG. 3 where the vertical axis is the current I injected into SSPLL 170 and the horizontal axis is the phase error $\Phi$ at RF sampler 172. In an aspect, a locking point is when the net current (i.e., sum of SSPLL current and FCL current) is zero and when the feedback is negative (i.e., when the derivative of the current with respect to time if positive). The vertical boundary lines 200 indicate where the SSPLL current and FCL current cancel, i.e., the magnitude of the SSPLL current and the FCL current are the same, but opposite in sign, causing SSPLL 170 to settle at a false locking point, that is different from the correct locking point 310, since the sum of the magnitude of SSPLL current and FCL current is zero at the vertical boundary lines. This false locking point will have a static phase offset at the RF sampler and elevated noise relative to a signal having the correct phase lock of the reference frequency.

Figure 4:
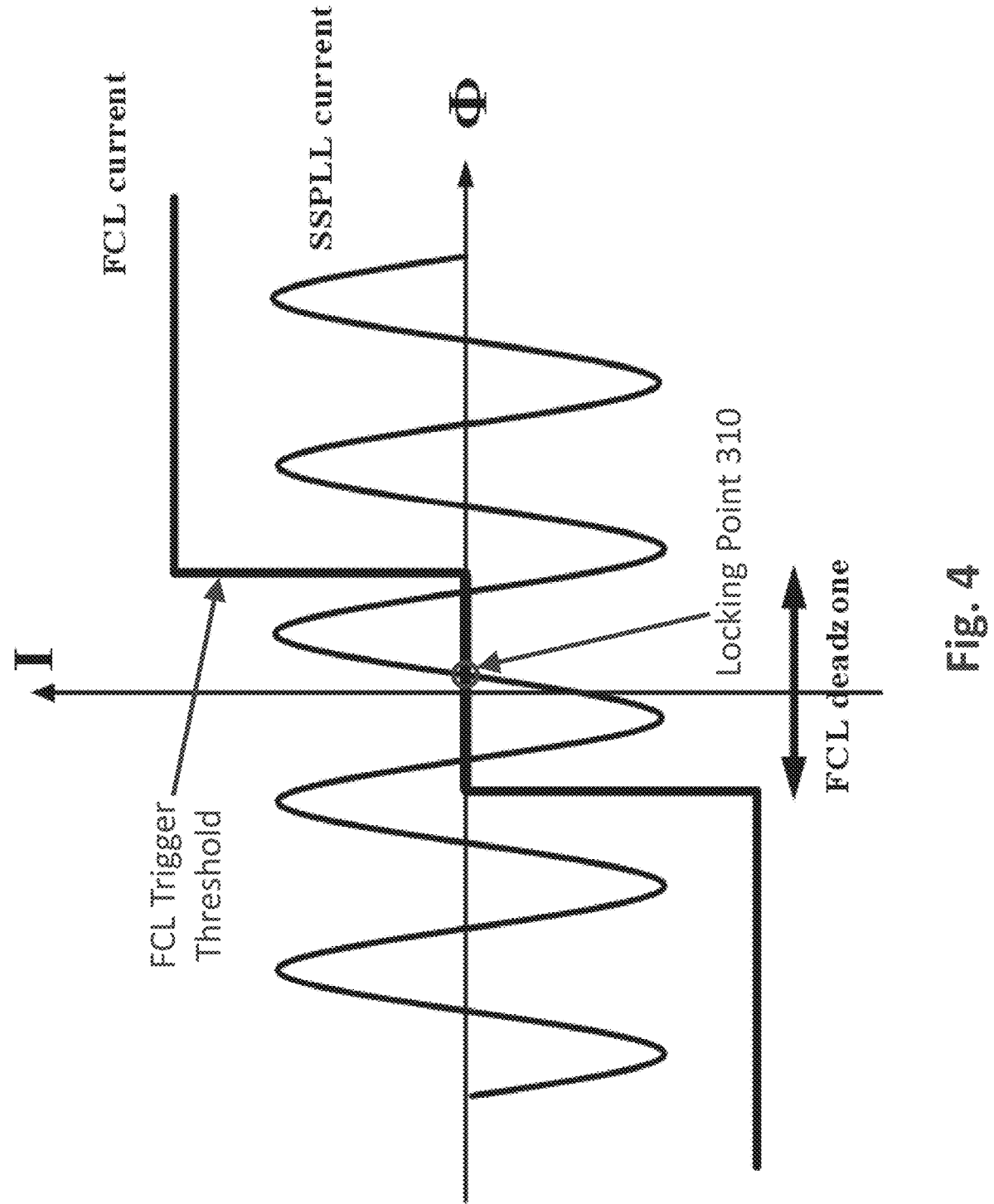
FIG. 4 is a signal diagram illustrating another interaction between a SSPLL and a FCL of the PLL of FIG. 2 in one embodiment.

In a fractional N SSPLL, the reference frequency input to PLL 150 is time dithered and can cause FCL 160 to erroneously trigger. For example, as seen in FIG. 4, FCL 160 has a nonlinear gain characteristic and vertical boundary lines 200 in FIG. 3 are no longer present thus false locking points may not be triggered, but since the SSPLL locking point 310 is relatively close to the FCL trigger threshold, any slight disturbance on the VCO supply rail may change the VCO phase and move the phase across the FCL trigger threshold in one direction or another, causing FCL 160 to activate and de-activate rapidly. Such a rapid cycling of FCL 160 due to a jitter in the VCO or another part of the PLL right around the FCL trigger threshold may cause a large amount of phase noise to be repeatedly injected into the system.

Figure 5:
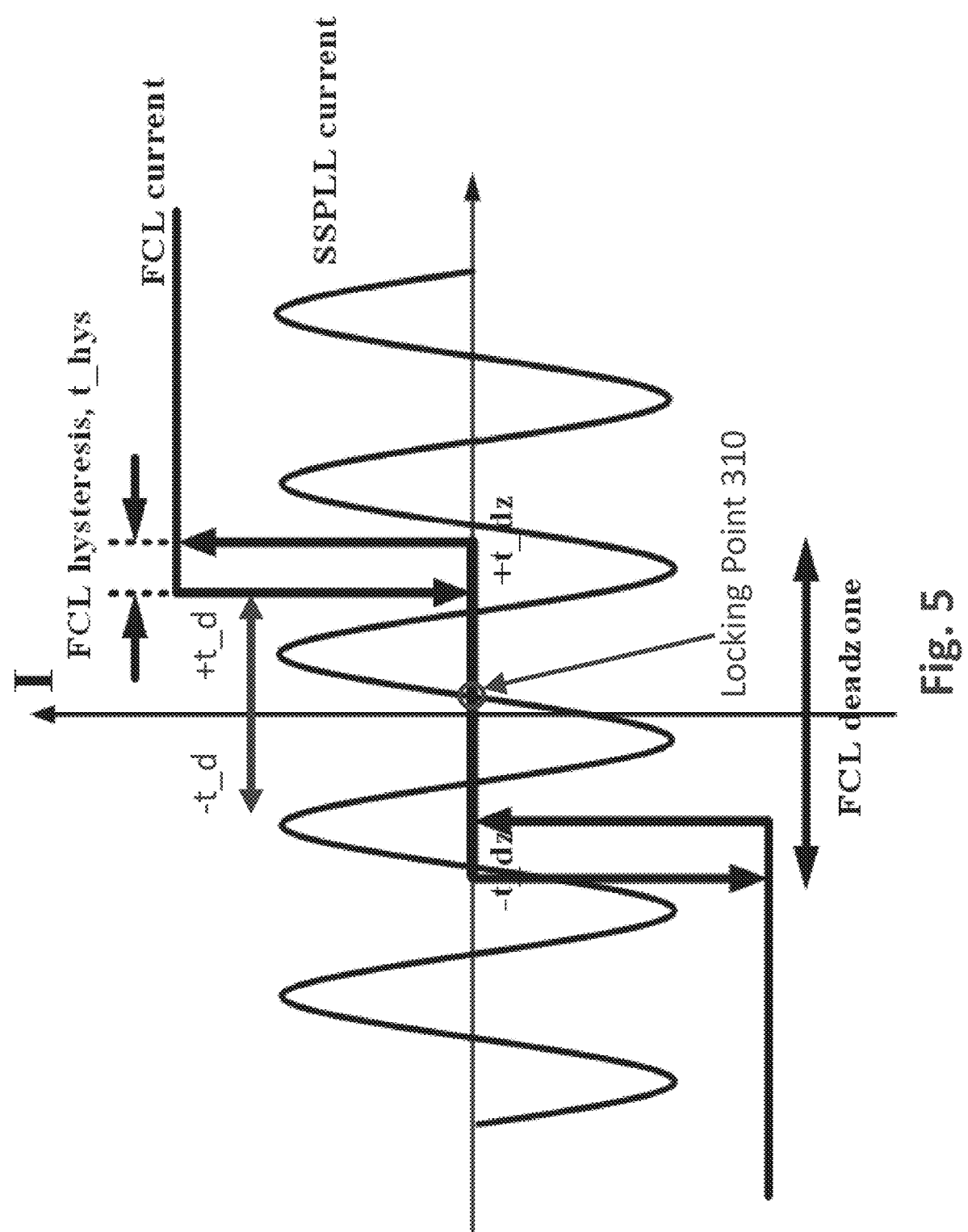
FIG. 5 is a signal diagram illustrating another interaction between a SSPLL and a FCL of the PLL of FIG. 2 in which deadzone and hysteresis is implemented in one embodiment.
Figure 6:
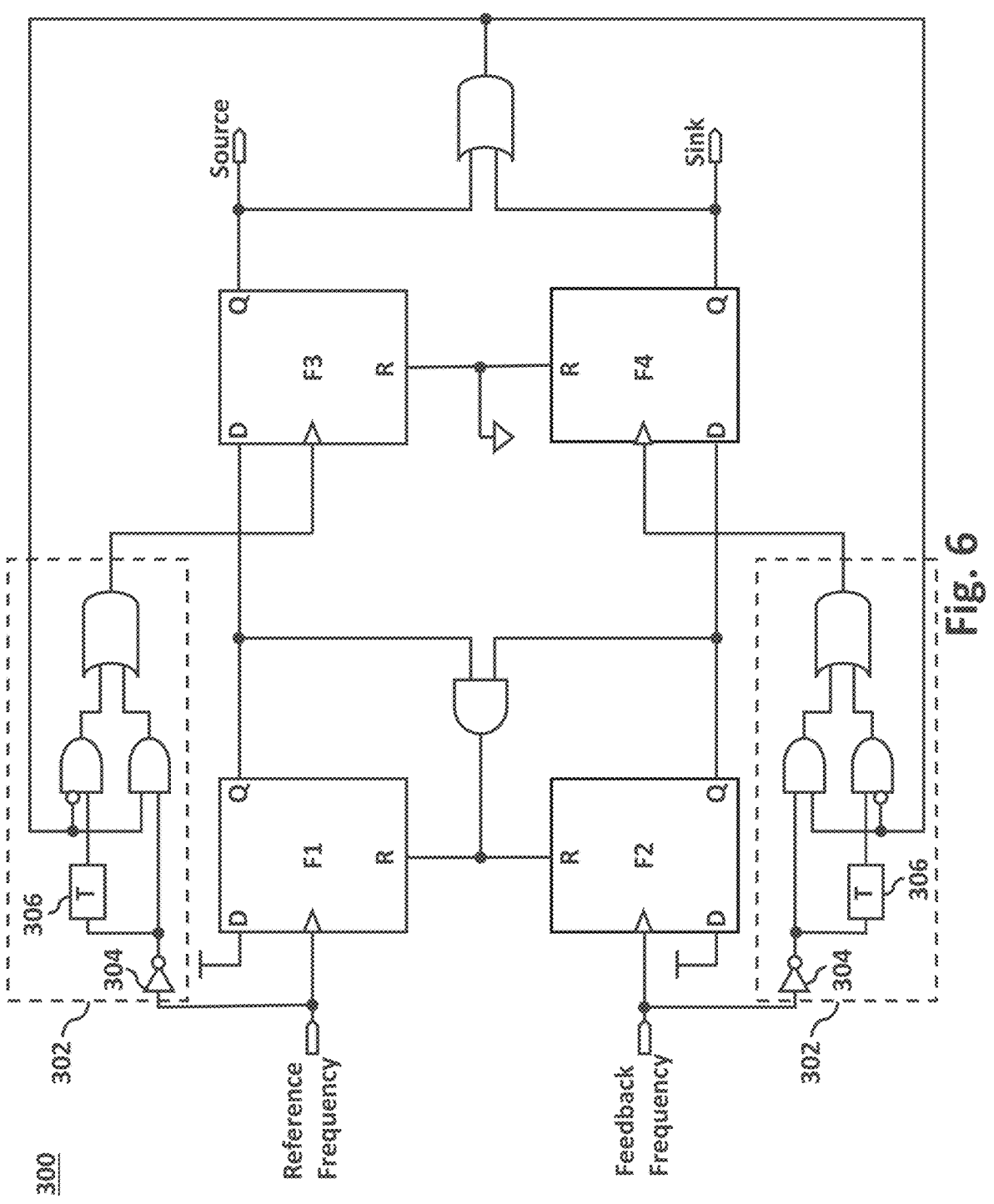
FIG. 6 is a circuit diagram illustrating an example implementation of a phase detector of a FCL of the PLL of FIG. 2 in which deadzone and hysteresis is implemented in one embodiment.

With reference to FIGS. 5 and 6, in an embodiment, PLL 150 may include a PFD/CP 164 that is configured to address at least the FCL/SSPLL false locking and the FCL false triggering by utilizing a PFD 300 that implements a deadzone with a hysteresis delay. PFD 300 includes two programmable delay parameters, an FCL deadzone delay parameter and a FCL hysteresis delay parameter.

The FCL deadzone delay parameter is a trigger threshold t_dz of PFD 300 that is set by the combination of a deadzone t_d and a hysteresis delay t_hys. For PFD 300 in a reset state, phase errors less than the deadzone t_d+hysteresis delay t_hys will not set the PFD 300 and no charge will be injected into SSPLL 170.

The FCL hysteresis delay parameter t_hys defines the re-trigger margin of FCL 160. When FCL 160 is triggered by PFD 300 detecting a phase error exceeding the deadzone t_d+hysteresis delay t_hys, FCL 160 continuously injects charge into SSPLL 170 until the phase error falls below the deadzone t_d and FCL 160 is deactivated. FCL 160 will not re-trigger until PFD 300 once again detects a phase error that exceeds deadzone t_d+hysteresis t_hys. In this manner, the hysteresis delay parameter t_hys may be utilized to inhibit a rapid activation and deactivation of FCL 160 by ensuring that there is a phase gap of t_hys between the trigger point t_dz and the deactivation point t_d of FCL 160. Further, as shown in FIG. 5, since FCL 160 is configured to have a nonlinear gain characteristic, false locking can be avoided.

FIG. 6 illustrates a circuit diagram for implementing an example PFD 300 of FCL 160. PFD 300 can be implemented as PFD/CP 164 shown in FIG. 2.

PFD 300 comprises latches F1 and F2 which generate a linear characteristic where the time that the source current is active is proportional to the phase difference between the reference frequency and the feedback frequency. PFD 300 also comprises latches F3 and F4 and a latch delay logic 302 that is disposed between the clock inputs of F1 and F2 and latches F3 and F4 which implements the deadzone and hysteresis delay logic of FCL 160. In one embodiment, PFD 300 can be always active and ready to source or sink current when output of latches F3 or F4 go high.

Latch delay logic 302 defines a deadzone using a deadzone delay element 304, e.g., an inverter that is configured to generate the desired deadzone t_d, a hysteresis delay element 306 that is configured to generate a desired hysteresis delay t_hys and logic for controlling latches F3 and F4 based on the outputs of deadzone delay element 304, hysteresis delay element 306 and the Q outputs of latches F3 and F4. In some embodiments, deadzone delay logic element 304 may comprise a programmable parameter that is configured to adjust the size of the deadzone t_d. In some embodiments, a value T of hysteresis delay element 306 may be programmable to adjust the amount of hysteresis delay t_hys to be added to the deadzone t_d to set the trigger point t_dz.

In an example, latch delay logic 302 may be configured such that, in the reset state where the source and sink outputs of latches F3 and F4 are low, latches F3 and F4 will not set until the phase difference between the reference frequency input and the feedback frequency input exceeds half of the reference period+the hysteresis delay t_hys.

Similarly, the latch delay logic 302 may be configured such that, in the set state where one or both of the source and the sink outputs of latches F3 and F4 is high, latches F3 and F4 will remain in the set state until the phase difference between the reference frequency input and the feedback frequency input is reduced to less than half the reference period.

FIG. 7 is a flowchart of an example process that can implement a PLL having a FCL with deadzone and hysteresis in one embodiment. Process 700 in FIG. 7 may be implemented using, for example, timing circuit 110 discussed above. An example process may include one or more operations, actions, or functions as illustrated by one or more of blocks 702, 704, 706, 708, and/or 710. Although illustrated as discrete blocks, various blocks may be divided into additional blocks, combined into fewer blocks, eliminated, performed in different order, or performed in parallel, depending on the desired implementation.

Process 700 can be performed by a timing circuit (e.g., timing circuit 110) to synchronize a plurality of networks. Process 700 can begin at block 702. At block 702, the timing circuit can activate PLL 150.

Process 700 can proceed from block 702 to block 704. At block 704, PLL 150 determines that the phase difference between a reference frequency and a feedback frequency is above a first predetermined threshold. For example, the first predetermined threshold may correspond to a combination of deadzone t_d and hysteresis delay t_hys.

Process 700 can proceed from block 704 to block 706. At block 706, the PLL 150 activates the charge pump of FCL 160 based on the determination that the phase difference between the reference frequency and the feedback frequency is above the first predetermined threshold.

Process 700 can proceed from block 706 to block 708. At block 708, PLL 150 determines that the phase difference between a reference frequency and a feedback frequency is below a second predetermined threshold. For example, the second predetermined threshold may correspond to the deadzone t_d.

Process 700 can proceed from block 708 to block 710. At block 710, PLL 150 deactivates the charge pump of FCL 160 based on the determination that the phase difference between the reference frequency and the feedback frequency is below the second predetermined threshold.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
a phase lock loop of a timing circuit, the phase lock loop comprising:
a voltage-controlled oscillator;
a sub-sampling phase lock loop circuit; and
a frequency correction loop circuit, the frequency correction loop circuit being configured to:
activate a charge pump to inject a charge into the voltage-controlled oscillator based on a phase difference between a reference signal and a feedback signal being greater in magnitude than a deadzone delay parameter plus a hysteresis delay parameter; and
de-activate the charge pump based on the magnitude of the phase difference between the reference signal and the feedback signal falling below the deadzone delay parameter, wherein the deadzone delay parameter and the hysteresis delay parameter are each separately programmable.

2. The semiconductor device of claim 1, wherein the frequency correction loop circuit comprises a phase detector, the phase detector comprising:
a first latch that is configured to be set based on the reference signal to generate a first latch output signal;
a second latch that is configured to be set based on the feedback signal to generate a second latch output signal;
a third latch that is configured to be set based on the first latch output signal, the deadzone delay parameter and the hysteresis delay parameter; and
a fourth latch that is configured to be set based on the second latch output signal, the deadzone delay parameter and the hysteresis delay parameter.

3. The semiconductor device of claim 2, wherein:

the first latch and the second latch are configured to be reset based on the first latch output signal and second latch output signal both being set;

the third latch is configured to be reset based on the first latch output signal of the first latch and the deadzone delay parameter; and the fourth latch is configured to be reset based on the second latch output signal of the second latch and the deadzone delay parameter.

4. The semiconductor device of claim 1, wherein the sub-sampling phase lock loop circuit is configured to activate and de-activate the frequency correction loop circuit based on the reference signal and feedback from the voltage-controlled oscillator.

5. The semiconductor device of claim 1, wherein the deadzone delay parameter corresponds to one half of a period of the reference signal.

6. A frequency correction loop of a timing circuit, the frequency correction loop comprising:

a charge pump that is configured to inject a charge into a voltage-controlled oscillator of the timing circuit; and a phase detector that is configured to control an activation of the charge pump, the phase detector comprising:

a first latch that is configured to be set based on a reference signal to generate a first latch output signal;

a second latch that is configured to be set based on a feedback signal from the voltage-controlled oscillator to generate a second latch output signal;

a first latch delay circuit;

a third latch that is configured to be set based on the first latch output signal and a first delay signal output by the first latch delay circuit;

a second latch delay circuit; and a fourth latch that is configured to be set based on the second latch output signal and a second delay signal output by the second latch delay circuit, wherein the first and second latch delay circuits are each configured with a modifiable delay parameter that is configured to adjust a delay between a setting of the corresponding first and second latches and a setting of the corresponding third and fourth latches, wherein:

the first latch delay circuit and the second latch delay circuit are each configured with a modifiable delay parameter, comprising a deadzone delay parameter and a hysteresis delay parameter, that is configured to adjust a delay between a setting of the corresponding first latch and second latch and a setting of the corresponding third latch and fourth latch; and the deadzone delay parameter and the hysteresis delay parameter are each separately programmable.

7. The frequency correction loop of claim 6, wherein the deadzone delay parameter corresponds to one half of a period of the reference signal.

8. The frequency correction loop of claim 6, wherein the delay between the setting of the corresponding first latch and second latch latches and the setting of the corresponding third latch and fourth latch comprises a combination of the deadzone delay parameter and the hysteresis delay parameter.

9. A semiconductor device comprising a phase detector of a timing circuit, the phase detector being configured to:

control an activation of a charge pump of the timing circuit, the charge pump being configured to inject a charge into a voltage-controlled oscillator of the timing circuit;

enter a set state from a reset state in response to a phase difference between a reference signal and a feedback signal exceeding a predetermined deadzone delay corresponding to the reference signal plus a predetermined hysteresis delay, the phase detector being configured to activate the charge pump when in the set state and disable the charge pump when in the reset state; and enter the reset state from the set state in response to the phase difference between the reference signal and the feedback signal being reduced to less than the predetermined deadzone delay, wherein the predetermined deadzone delay and the predetermined hysteresis delay are each separately programmable.

10. The semiconductor device of claim 9 wherein the reset state of the phase detector corresponds to a source output and a sink output of the phase detector being low.

11. The semiconductor device of claim 9 wherein the set state of the phase detector corresponds to one of a source output and a sink output of the phase detector being high.

12. The semiconductor device of claim 9 wherein:

the phase detector comprises a first pair of latches and a second pair of latches;

the first pair of latches are set based on one of the reference signal and the feedback signal, respectively; and the second pair of latches are each set in response to a corresponding one of the first pair of latches being set and the phase difference between the reference signal and the feedback signal exceeding the predetermined deadzone delay corresponding to the reference signal plus the predetermined hysteresis delay.

13. The semiconductor device of claim 12 wherein the phase detector comprises a pair of latch delay circuits, each latch delay circuit being disposed between the reference signal or feedback signal and a corresponding one of the second pair of latches and defining the predetermined deadzone delay and the predetermined hysteresis delay.

14. The semiconductor device of claim 9 wherein predetermined deadzone delay corresponds to half of a period of the reference signal.

* * * * *